(12) United States Patent
Oh et al.

(10) Patent No.: US 9,691,819 B2
(45) Date of Patent: Jun. 27, 2017

(54) VERTICAL TRANSISTOR AND VARIABLE RESISTIVE MEMORY DEVICE INCLUDING THE SAME

(71) Applicant: SK hynix Inc., Gyeonggi-do (KR)

(72) Inventors: Dong Yean Oh, Gyeonggi-do (KR); Nam Kyun Park, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 14/842,300

(22) Filed: Sep. 1, 2015

(65) Prior Publication Data

US 2016/0300886 A1 Oct. 13, 2016

(30) Foreign Application Priority Data

Apr. 10, 2015 (KR) ........................ 10-2015-0050937

(51) Int. Cl.
*H01L 27/24* (2006.01)
*H01L 29/78* (2006.01)
*H01L 29/423* (2006.01)
*H01L 29/08* (2006.01)
*H01L 45/00* (2006.01)

(52) U.S. Cl.
CPC ...... *H01L 27/2454* (2013.01); *H01L 29/0847* (2013.01); *H01L 29/42376* (2013.01); *H01L 29/7827* (2013.01); *H01L 29/7831* (2013.01); *H01L 45/06* (2013.01); *H01L 45/126* (2013.01); *H01L 45/1233* (2013.01)

(58) Field of Classification Search
CPC ............. H01L 45/1253; H01L 257/329; H01L 29/66712; H01L 29/7802; H01L 438/238; H01L 27/0629; H01L 27/0727; H01L 27/0738; H01L 28/20; H01L 21/823487; H01L 21/823885; H01L 29/66666; H01L 29/66893; H01L 29/68; H01L 29/732
See application file for complete search history.

(56) References Cited

U.S. PATENT DOCUMENTS

| | | | |
|---|---|---|---|
| 8,946,670 B1 * | 2/2015 | Park | H01L 27/2436 257/2 |
| 2008/0173933 A1 * | 7/2008 | Fukuzumi | H01L 21/8221 257/324 |
| 2010/0072455 A1 * | 3/2010 | Crowder | B82Y 10/00 257/9 |
| 2014/0239247 A1 | 8/2014 | Park | |
| 2015/0048293 A1 * | 2/2015 | Park | H01L 27/2436 257/2 |

* cited by examiner

*Primary Examiner* — Julio J Maldonado
*Assistant Examiner* — Stanetta Isaac
(74) *Attorney, Agent, or Firm* — IP & T Group LLP

(57) ABSTRACT

A vertical transistor may include a pillar, a gate and an electric field-buffering region. The pillar may be vertically extended from a surface of a semiconductor substrate. The pillar may include a source, a channel region and a drain. The gate may be formed on an outer surface of the pillar. The gate may be overlapped with the channel region, a portion of the source configured to make contact with the channel region, and a portion of the drain configured to make contact with the channel region. The electric field-buffering region may be formed in the portion of the drain overlapped with the gate. The electric field-buffering region may have a band gap different from a band gap of a material in the pillar.

16 Claims, 11 Drawing Sheets

VERTICAL TRANSISTOR AND VARIABLE RESISTIVE MEMORY DEVICE INCLUDING THE SAME

CROSS-REFERENCES TO RELATED APPLICATION

The present application claims priority under 35 U.S.C. §119(a) to Korean application number 10-2015-0050937, filed on Apr. 10, 2015, which is herein incorporated by reference in its entirety.

BACKGROUND

1. Technical Field

Various embodiments generally relate to a semiconductor integrated circuit device, more particularly, to a vertical transistor and a variable resistive memory device including the vertical transistor.

2. Related Art

A semiconductor integrated circuit device may be highly integrated. Thus, in order to form a plurality of memory cells in a small area of the semiconductor integrated circuit device, a vertical transistor may be developed.

The vertical transistor may include a channel vertically formed on a semiconductor substrate. The vertical transistor may include a pillar-shaped active region.

The vertical transistor may include a gate, a source, and a drain. The gate may be configured to surround the pillar. The source may be formed in, under, or over the pillar and at one side of the gate. The drain may be formed in the pillar and at the other side of the gate. Further, the channel of the vertical transistor may be formed in the pillar and between the source and the drain.

Unlike a channel of a planar MOS transistor, the channel of the pillar-shaped vertical transistor may float. Therefore, a leakage current may occur due to the floating channel.

Particularly, when a voltage may be applied to the gate and the drain, a high electric field may be concentrated on an edge of the gate, particularly a boundary between the gate and the drain so that a gate induced drain leakage (GIDL) may be generated. The GIDL may become more serious in the floating channel.

SUMMARY

According to example embodiments, there may be provided a vertical transistor. The vertical transistor may include a pillar, a gate and an electric field-buffering region. The pillar may vertically extend from a surface of a semiconductor substrate. The pillar may include a source, a channel region and a drain. The gate may be formed on an outer surface of the pillar. The gate may overlap with the channel region, a portion of the source configured to make contact with the channel region, and a portion of the drain configured to make contact with the channel region. The electric field-buffering region may be formed in the portion of the drain overlapped with the gate. The electric field-buffering region may have a band gap different from a band gap of a material in the pillar.

In example embodiments, the gate may include a first gate and a second gate. The first gate may be configured to surround the channel region between the source and the drain. The second gate may be positioned over the first gate. The second gate may be configured to surround the electric field-buffering region. The second gate may have a work function different from a work function of the first gate.

An additional electric field-buffering region may be formed in the portion of the source overlapped with the gate. The gate may include a first gate, a second gate and a third gate. The first gate may be configured to surround the channel region between the source and the drain. The second gate may be positioned over the first gate. The second gate may be configured to surround the additional electric field-buffering region. The third gate may be positioned under the first gate. The third gate may be configured to surround the additional electric field-buffering region. The second gate and the third gate may have a work function different from a work function of the first gate.

According to example embodiments, there may be provided a vertical transistor. The vertical transistor may include a pillar, a gate and a work function-controlling layer. The pillar may include a first junction region, a second junction region and a channel region. The first junction region may be positioned in a lower region of the pillar. The second junction region may be positioned in an upper region of the pillar. The channel region may be formed between the first junction region and the second junction region. The gate may be configured to surround a portion of the pillar corresponding to the channel region and portions of the first and second junction regions adjacent to the channel region. The work function-controlling layer may be formed in at least one of the first junction region and the second junction region overlapped with the gate to decrease a difference between a work function of the first junction region and a work function of the second junction region. The work-function-controlling layer may be formed along an edge portion of the pillar.

In example embodiments, the work function-controlling layer may include a semiconductor material having a band gap different from a band gap of a material in the pillar. For example, when the pillar may include silicon, the work function-controlling layer may include Ge, SiGe, GaAs, SiC, etc.

According to example embodiments, there may be provided a variable resistive memory device. The variable resistive memory device may include a semiconductor substrate, a plurality of vertical pillars, a gate, an electric field-buffering region and a variable resistance region. The semiconductor substrate may include a common source region. The vertical pillars may be formed on the semiconductor substrate. Each of the vertical pillars may include a channel region and a drain region. The gate may be configured to surround the channel region and a portion of the drain region adjacent to the channel region. The electric field-buffering region may be formed in the portion of the drain region overlapped with the gate. The variable resistance region may be electrically connected with the drain region.

BRIEF DESCRIPTION OF THE DRAWINGS

Exemplary embodiments will be described with reference to the accompanying drawings.

FIG. 1 is a cross-sectional view illustrating a vertical transistor in accordance with exemplary embodiments;

FIG. 2 is a cross-sectional view taken along a line II-II' in FIG. 1;

FIG. 3 is a cross-sectional view taken along a line III-III' in FIG. 1;

FIG. 4 is a diagram illustrating an energy band of a vertical transistor in accordance with exemplary embodiments;

FIG. 5 is a cross-sectional view illustrating a vertical transistor in accordance with exemplary embodiments;

FIG. 6 is a cross-sectional view illustrating a vertical transistor in accordance with exemplary embodiments;

FIG. 7 is a cross-sectional view illustrating a vertical transistor in accordance with exemplary embodiments;

FIG. 8 is a diagram illustrating an energy band of a vertical transistor in accordance with exemplary embodiments;

FIG. 9 is a cross-sectional view illustrating a vertical transistor in accordance with exemplary embodiments;

FIG. 10 is a cross-sectional view illustrating a vertical transistor in accordance with exemplary embodiments;

FIG. 11 is a cross-sectional view illustrating a vertical transistor in accordance with exemplary embodiments;

FIG. 12 is a cross-sectional view illustrating a vertical transistor in accordance with exemplary embodiments;

FIG. 13 is a cross-sectional view illustrating a vertical transistor in accordance with exemplary embodiments;

FIG. 14 is a perspective view illustrating a variable resistive memory device including a vertical transistor in accordance with exemplary embodiments;

FIG. 15 is a perspective view illustrating a variable resistance region in FIG. 14;

FIG. 16 is a block diagram illustrating a microprocessor in accordance with exemplary embodiments;

FIG. 17 is a block diagram illustrating a processor in accordance with exemplary embodiments; and FIG. 18 is a block diagram illustrating a system in accordance with exemplary embodiments.

DETAILED DESCRIPTION

Figure 1:
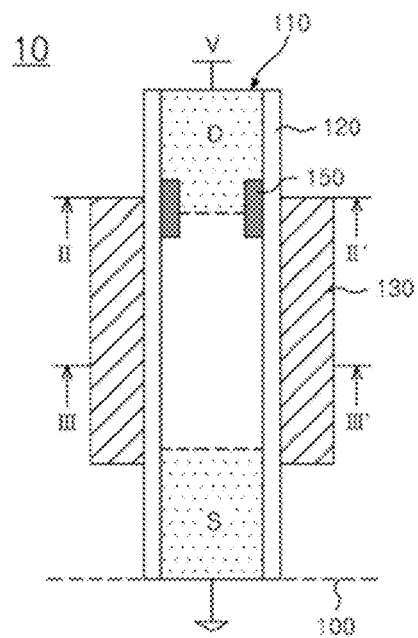
FIGS. 1 to 18 illustrate non-limiting examples and embodiments.

Various exemplary embodiments will be described more fully hereinafter with reference to the accompanying drawings, in which some embodiments are shown. The present invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that terms such as first, second, and third may be used herein to describe various elements, components, regions, layers and/or sections, and these elements, components, regions, layers and/or sections should not be limited by these terms. These terms are only used to distinguish one element, component, region, layer or section from another element, component, region, layer or section.

Spatially relative terms, such as "beneath," "below," "lower," "above," "upper" and the like may be used herein to describe the relationship between element(s) or feature(s) as illustrated in the figures. It will be understood that the spatially relative terms provided herein is exemplary and may have different orientations from the orientation depicted herein. For example, in a situation where the device shown in the given figures is turned over, elements described as "below" or "beneath" other elements or features would then be placed "over" or "above" the other elements or features. Thus, the exemplary term "below" may indicate either "above" or "below." The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations. Variations in shapes, in manufacturing techniques, and/or in tolerances are expected. Thus, embodiments should not be construed as limited to the particular shapes of regions illustrated herein. For example, even though illustrated as a rectangle, an implanted region may be rounded or curved. In addition, implant concentration may be different depending on locations.

Unless otherwise defined, all terms including technical and scientific terms, used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art.

Hereinafter, exemplary embodiments will be described in detail with reference to the accompanying drawings.

Figure 2:
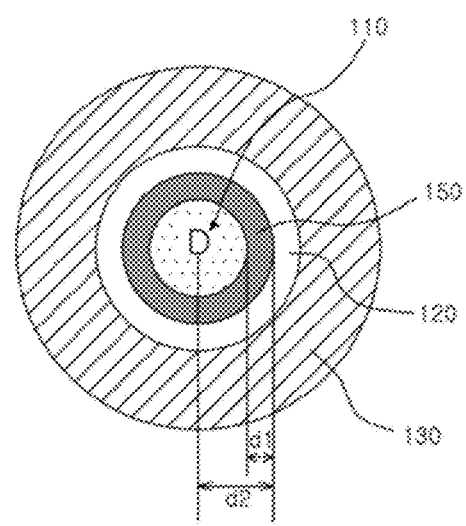
Figure 3:
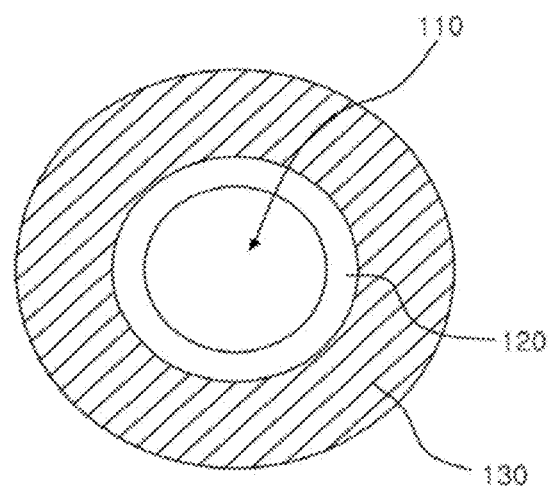

FIG. 1 is a cross-sectional view illustrating a vertical transistor in accordance with an embodiment, FIG. 2 is a cross-sectional view taken along the line II-II' in FIG. 1, and FIG. 3 is a cross-sectional view taken along the line III-III' in FIG. 1.

Referring to FIGS. 1 to 3, a vertical transistor 10 of this embodiment may include a pillar 110. For example, the pillar 110 may serve as an active region of the vertical transistor 10. The pillar 110 may include a semiconductor material such as silicon. The pillar 110 may vertically extend from a surface of a semiconductor substrate 100.

Impurities may be implanted into the pillar 110 to form the source S and the drain D in accordance with types of MOS transistors. For example, when the source S and the drain D are formed using an impurity in group V, an NMOS transistor may be manufactured. When the source S and the drain D are formed using an impurity in group III, a PMOS transistor may be manufactured.

Further, in manufacturing the NMOS transistor, a power source voltage V may be directly or indirectly applied to the drain D and a ground voltage may be directly or indirectly applied to the source S. In manufacturing the PMOS transistor, a power source voltage V may be directly or indirectly applied to the source S and a ground voltage may be directly or indirectly applied to the drain D.

A gate insulating layer 120 may be formed on an outer surface of the pillar 110. A gate 130 may be formed on the gate insulating layer 120. The gate 130 may be configured to surround a portion of the pillar 110 between the source S and the drain D. Since the source S and the drain D may correspond to impurity junction regions, edges of the gate 130 may be partially overlapped with the source S and the drain D, respectively. The gate 130 may include a conductive material such as a doped polysilicon layer, a metal layer, etc. To form a channel, a high level of voltage, for example, a voltage the same as or higher than a threshold voltage may be applied to gate 130 of the NMOS transistor. In contrast, a low level of a voltage, for example, a voltage lower than the threshold voltage may be applied to the gate 130 of the PMOS transistor.

Hereinafter, as a non-limiting embodiment, characteristics of the NMOS transistor may be illustrated. However, in another embodiment, the MOS transistor may include a PMOS transistor.

When an N type impurity may be doped into a portion of the pillar 110 including silicon, a Fermi level in the portion of the pillar 110 may be increased. A work function of the silicon in which the impurity may be doped may be lower than a work function of intrinsic silicon in which the impurity is not doped.

To operate the NMOS transistor, power supply voltage V may be applied to the drain D. A gate voltage may be applied to the gate 130. A relatively high electric field may be concentrated on an edge portion of the gate 130 overlapped with the drain D. Particularly, when the gate insulating layer 120 has a very thin thickness, an electric field between the gate 130 and the drain D may be greatly increased so that a high GIDL may be generated.

To prevent the GIDL, an electric field-buffering region 150 may be formed at a peripheral portion of the drain D which overlaps with the edge portion of the gate 130. The electric field-buffering region 150 may serve as a work function-controlling layer. Referring to FIGS. 2 and 3, the electric field-buffering region 150 may have an annular shape formed along an edge portion of the drain D overlapped with the gate 130. The electric field-buffering region 150 may not be formed at other portions of the drain D when considering channel mobility.

A width d1 of the electric field-buffering region 150 may be determined by balancing (i) efficiency in buffering the electric field concentrated at a boundary between the gate 130 and the drain and (ii) the channel mobility. For example, the width d1 of the electric field-buffering region 150 may be about 5% to about 50% of a radius d2 of the pillar 110.

A material of the electric field-buffering region 150 may be determined in accordance with a work function of the gate 130 and a work function of the pillar 110. The material forming the electric field-buffering region 150 may have a band gap different from a band gap of the silicon in the pillar 110. For example, the material of the electric field-buffering region 150 may include Ge, SiGe, GaAs, SiC, a combination thereof, etc. Alternatively, the material of the electric field-buffering region 150 may include various semiconductor materials having a band gap different from the band gap of the silicon.

In a NMOS transistor, the electric field-buffering region 150 may include a semiconductor material having a band gap less than a band gap of the pillar 110. In contrast, in a PMOS transistor, the electric field-buffering region 150 may include a semiconductor material having a band gap greater than a band gap of the pillar 110.

The electric field-buffering region 150 may increase the work function of the drain D overlapped with the gate 130. Thus, the difference between the work function of the gate 130 and the work function of the drain D narrows, thereby reducing the leakage current.

Figure 4:
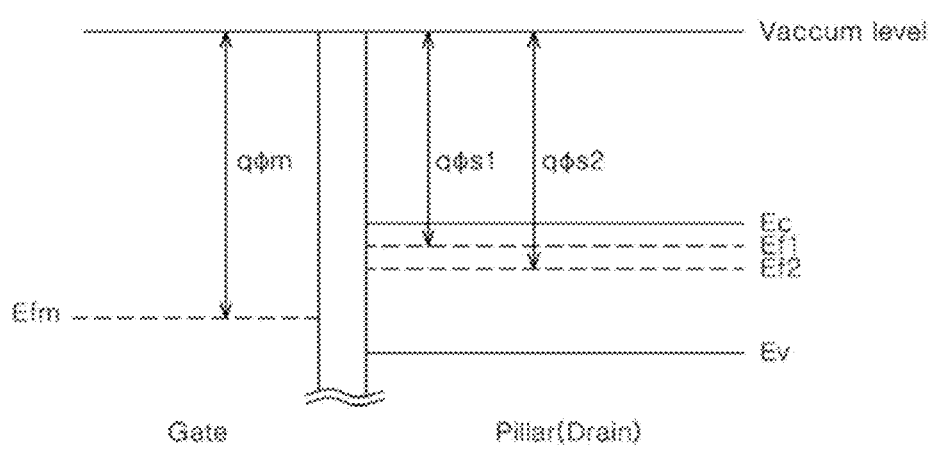

Referring to FIG. 4, when the vertical transistor may include the NMOS transistor, a Fermi level Ef1 of the drain D doped with an N+ type impurity may move toward a conduction band of the silicon. The gate 130 including a metal layer or the conductive layer may have a work function qΦm of about 4.0 eV to about 5.0 eV. Thus, a voltage difference may be generated between the work function qΦm of the gate 130 and the work function qΦs1 of the drain D which is doped with the impurity. The difference between the work functions may cause the leakage current.

In exemplary embodiments, when the electric field-buffering region 150 having the band gap different from the band gap of the drain D may be provided between the drain D and the gate 130. The drain D may be formed of silicon. For example, a material having a band gap less than the band gap of the silicon in the NMOS transistor or greater than the band gap of the silicon in the PMOS transistor may serve as the electric field-buffering region 150. The electric field-buffering region 150 may decrease the Fermi level Ef2 of the drain D overlapped with the edge portion of the gate 130. Therefore, the work function qΦs2 of the electric field-buffering region 150 may increase. As a result, the difference between the work function qΦm of the gate 130 and the work function qΦs1 of the drain d may be decreased, thereby reducing the GIDL. In FIG. 4, Efm may represent the Fermi level of the gate 130 and EV may represent a valence band of the drain D, that is, silicon.

Figure 5:
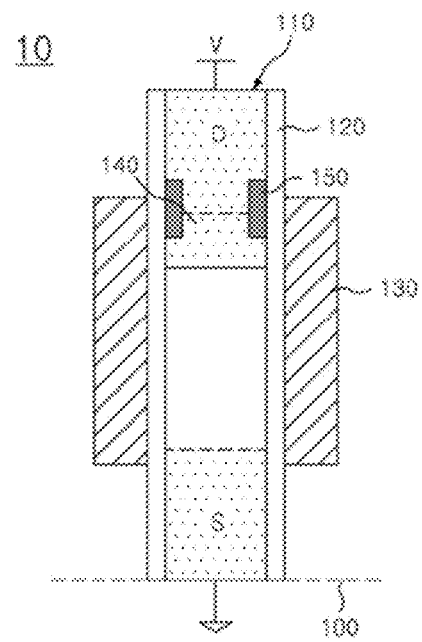

Referring to FIG. 5, an N⁻ type impurity may be implanted into the pillar 110 surrounded by the electric field-buffering region 150 to form a lightly doped drain (LDD) region 140. Since the LDD region 140 may have a concentration lower than a concentration of the drain D, the LDD region 140 may decrease the electric concentration on the boundary between the gate 130 and the drain D. Thus, the LDD region 140 and the electric field-buffering region 150 may effectively prevent the GIDL and a hot carrier effect.

Figure 6:
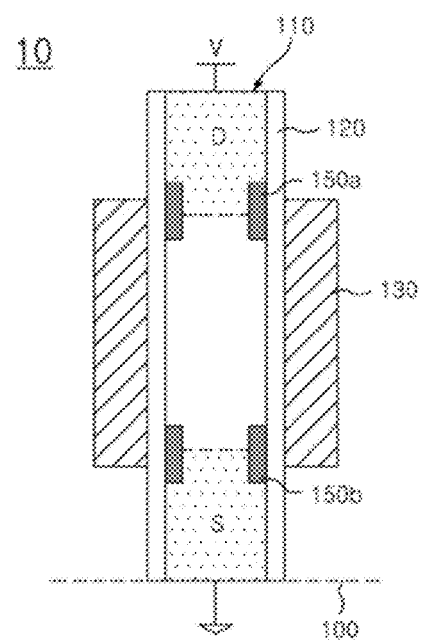

Referring to FIG. 6, a first electric field-buffering region 150a may be formed in an overlapped region of the gate 130 and the drain D. A second electric field-buffering region 10b may be formed in an overlapped region of the gate 130 and the source S. Each of the first electric field-buffering region 150a and the second electric field-buffering region 150b may include a material having a band gap different from the band gap of the silicon. For example, the material forming the first electric field-buffering region 150a, the second electric field-buffering region 150b or both regions 150a and 150b may have a band gap less than the band gap of the silicon in NMOS transistor.

In contrast, the material forming the first electric field-buffering region 150a, the second electric field-buffering region 150b or both regions 150a and 150b may have a band gap greater than the band gap of the silicon in PMOS transistor. The first electric field-buffering region 150a and the second electric field-buffering region 150b formed at the edge portions of the gate 130, respectively, may prevent a leakage current. In addition, the second electric field-buffering region 150b may reduce the GIDL when the source S and the drain D may be switched.

Figure 7:
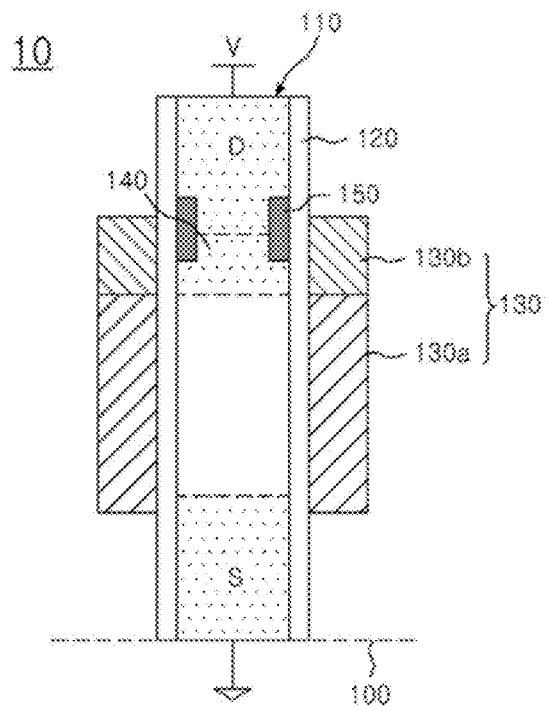

Referring to FIG. 7, the gate 130 may include a first gate 130a and a second gate 130b. The first gate 130a may be configured to surround the channel region, that is, a region between the source S and the drain D. The second gate 130b may be overlapped with the electric field-buffering region 150 at the drain D. Further, when the drain D includes the LDD region 140, the second gate 130b may be configured to surround the electric field-buffering region 150 and the LDD region 140.

Figure 8:
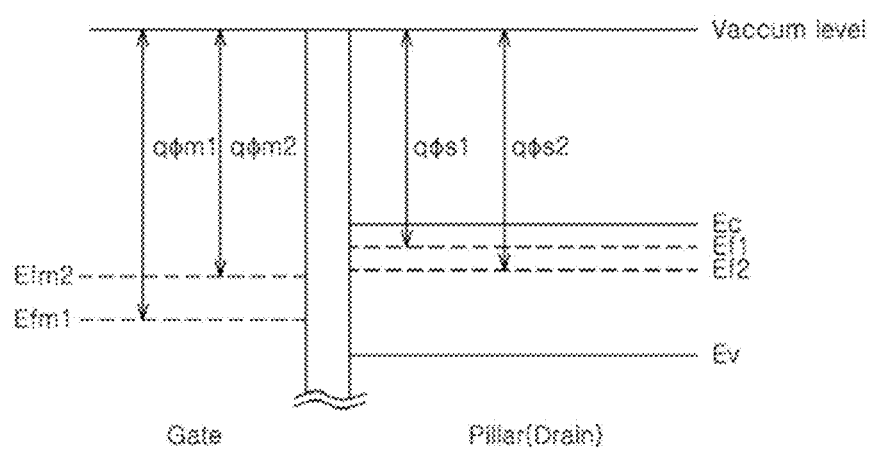

The first gate 130a may include a material having a first work function. The second gate 130b may include a material having a second work function less than the first work function. Thus, as shown in FIG. 8, since the second work function qΦm2 of the second gate 130b formed at the electric field concentration region may be lower than the first work function qΦm1 of the first gate 130a, a difference between the work function qΦs2 of the electric field-buffering region 150 and the second work function qΦm2 of the second gate 103b may narrow, thereby reducing the GIDL. In FIG. 8, qΦs1 may represent a work function of the drain D.

Figure 9:
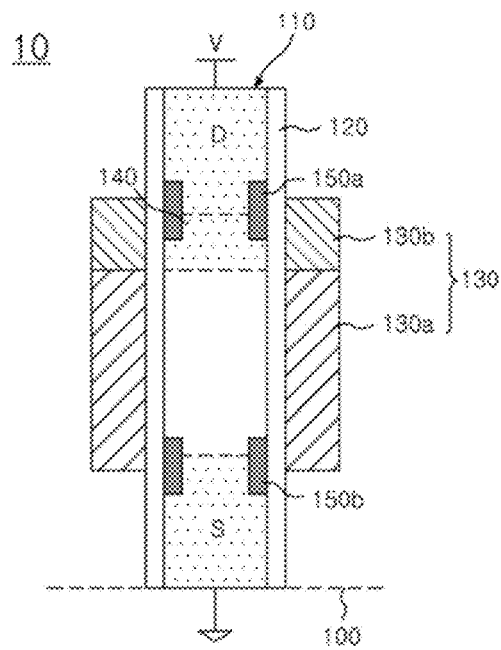

Referring to FIG. 9, a first electric field-buffering region 150a may be overlapped with the second gate 130b. A second electric field-buffering region 150b may be formed at an overlapped region of the first gate 130a and the source S. Thus, an electric field may not be concentrated on the both edge portions of the gate 130.

Figure 10:
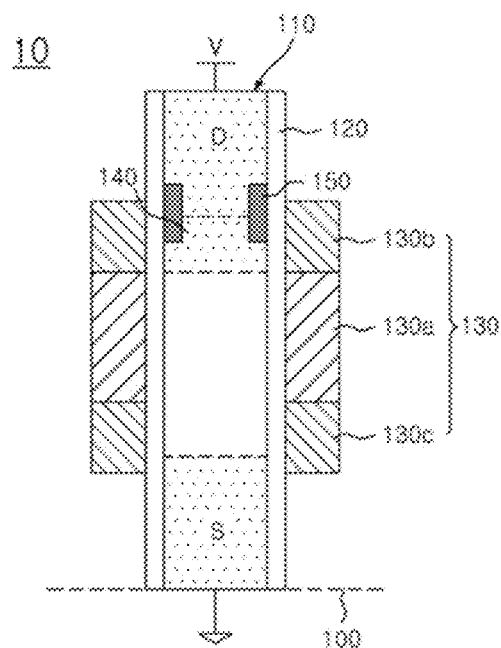

Referring to FIG. 10, the gate 130 may include a first gate 130a, a second gate 130b, and a third gate 130c. The first gate 130a may be configured to surround the channel region. The second gate 130b may be configured to surround an upper portion of the first gate 130a, that is, the drain D. The third gate 130c may be configured to surround a lower portion of the first gate 130a, that is, the source S. The first gate 130a may have a first work function. Each of the second gate 130b and the third gate 130c may have a second work function less than the first work function.

Figure 11:
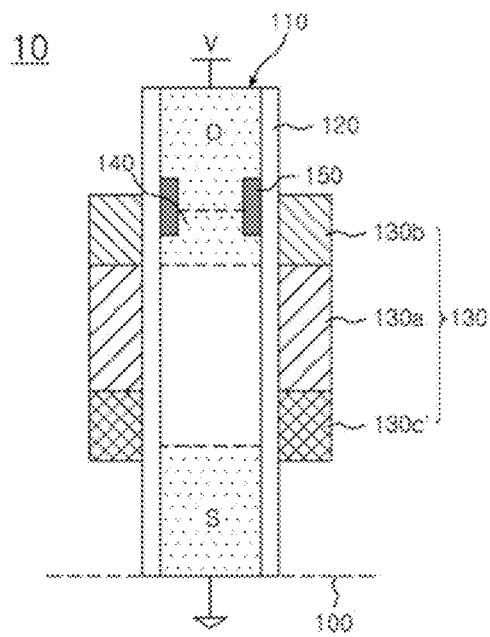

Referring to FIG. 11, a third gate 130c' may include a material having a third work function different from the first work function and the second work function. For example, the third work function may be less than the first work function and greater than the second work function. Alternatively, the third work function may be less than the first work function and the second work function. Thus, the electric field may not be concentrated on the both edge portions of the gate 130.

Figure 12:
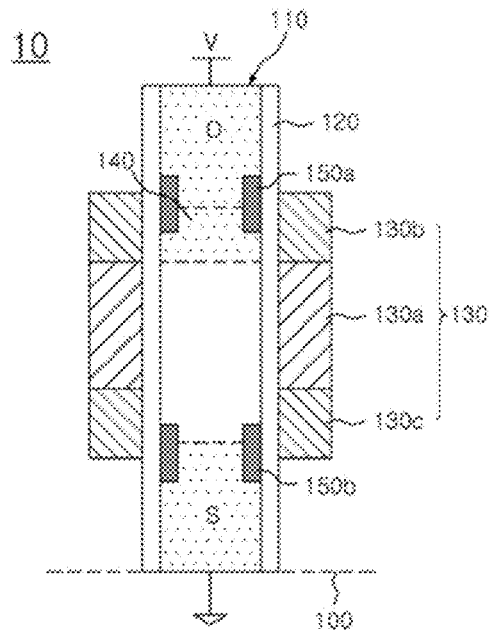
Figure 13:
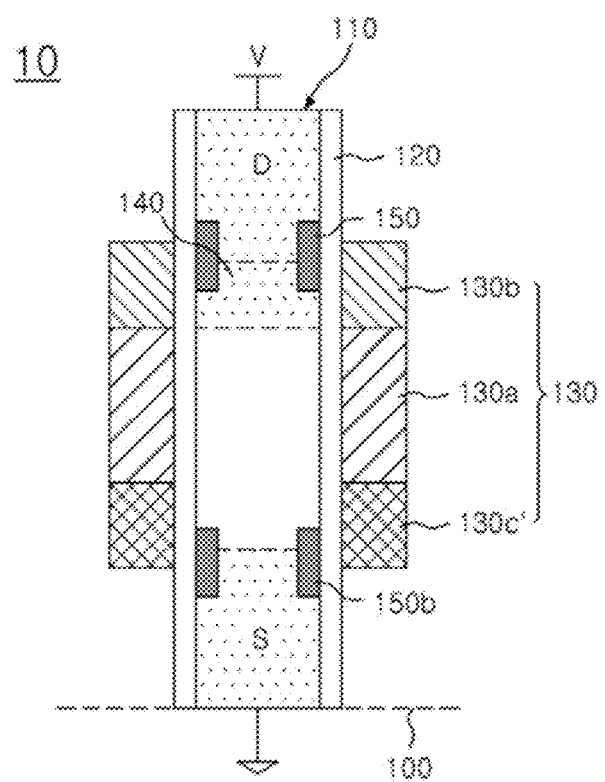

Referring to FIGS. 12 and 13, in a structure including the first to third gates 130a, 130b and 130c/130c', a first electric field-buffering region 150a formed at the pillar 110 may be overlapped with the second gate 130b. A second electric field-buffering region 150b formed at the pillar 110 may be overlapped with the third gate 130c/130c'.

The vertical transistors of these exemplary embodiments may be applied to a variable resistive memory device.

Figure 14:
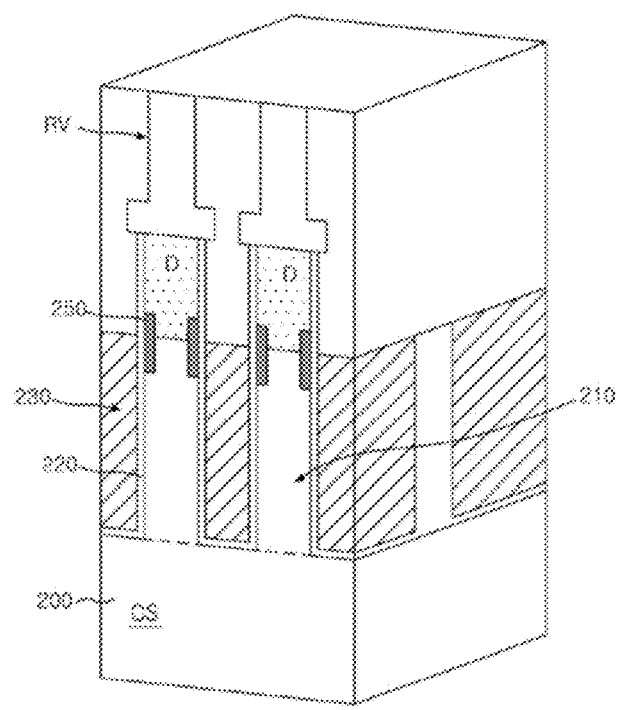

Referring to FIG. 14, a plurality of pillars 210 may be formed on a semiconductor substrate 200. Impurities may be implanted into the semiconductor substrate 200 under the pillars 210 to form a common source CS. Impurities may be implanted into an upper portion of each of the pillars 210 to form a drain D.

A gate 230 may be formed to surround the pillars 210. The gate 230 may include a single conductive layer. Alternatively, the gate 230 may include multi-layers having different work functions. When a gap between the pillars 210 is narrow, a space between the pillars 230 may be filled with the gate 230.

An electric field-buffering region 250 may be formed at an overlapped region of the gate 230 and the drain D. The electric field-buffering region 250 may include a material having a band gap different from a band gap of silicon in the pillars 210. For example, the electric field-buffering region 250 may include Ge, SiGe, GaAs, SiC, a combination thereof, etc. Alternatively, the electric field-buffering region 250 may include various semiconductor materials having a band gap greater than the band gap of silicon. The electric field-buffering region 2250 may be formed at both edge portions of the gate 230 as shown in FIGS. 6, 9, 12 and 13.

A variable resistance RV may be formed over the drain D. The variable resistance RV may be electrically connected to the drain D. The variable resistance RV may vary in accordance with the type of the variable resistive memory device. For example, when the variable resistive memory device includes a ReRAM, the variable resistance RV may include a PCMO layer. When the variable resistive memory device includes a PCRAM, the variable resistance RV may include a chalcogenide layer. When the variable resistive memory device includes an MRAM, the variable resistance RV may include a magnetic layer. When the variable resistive memory device includes an STTMRAM, the variable resistance RV may include a flux reversal layer.

Figure 15:
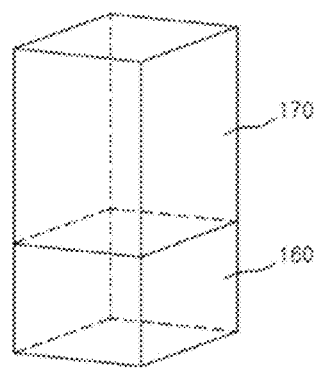

Particularly, when the variable resistive memory device includes the PCRAM, as shown in FIG. 15, the variable resistance RV may include a heating electrode 160 electrically connected to the drain D, and a phase changeable layer 170, for example, chalcogenide formed on the heating electrode 160.

According to exemplary embodiments, the electric field-buffering region may be formed at the overlapped region of the gate and the drain. GIDL may be generated in the overlapped region in the vertical transistor having a floating body structure. Due to the electric field-buffering region, the difference between the work functions of the gate and the drain may be decreased and thereby the leakage current is reduced. Since the electric field-buffering region may be positioned only at the overlapped region of the gate and the drain, the electric field-buffering region may not affect the channel mobility.

Further, the difference between the work functions may be reduced by forming the gates in the electric field-buffering region and the channel region with different materials from each other.

Figure 16:
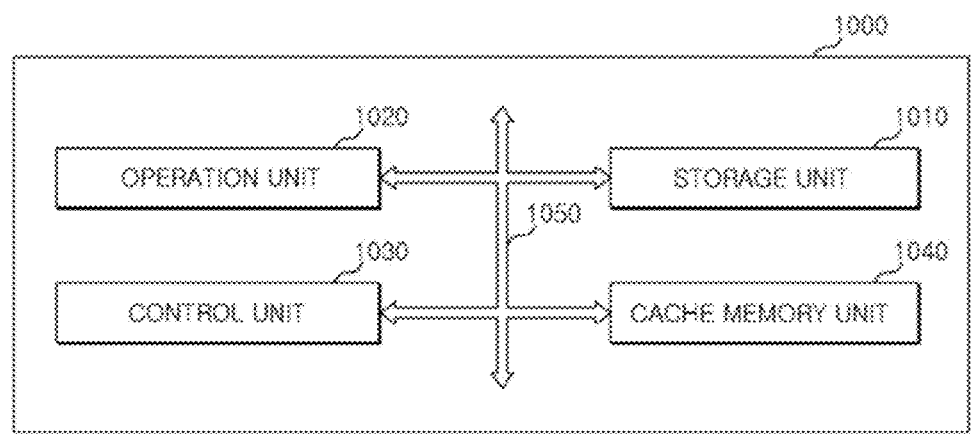

As illustrated in FIG. 16, a microprocessor 1000 to which the semiconductor device according to the embodiment is applied may control and adjust a series of processes, which receive data from various external apparatuses, process the data, and transmit processing results to the external apparatuses. The microprocessor 1000 may include a storage unit 1010, an operation unit 1020, and a control unit 1030. The microprocessor 1000 may be a variety of processing apparatuses, such as a micro processing unit (MPU), a central processing unit (CPU), a graphic processing unit (GPU), a digital signal processor (DSP), or an application processor (AP).

The storage unit 1010 may be a processor register or a register, and the storage unit may be a unit that stores data in the microprocessor 1000 and may include a data register, an address register, and a floating point register. The storage unit 1010 may include various registers other than the above-described registers. The storage unit 1010 may temporarily store data to be processed in the operation unit 1020, resulting data that was processed in the operation unit 1020, and an address in which the data is stored.

The storage unit 1010 may include one of the semiconductor devices according to the embodiments of the present invention. The storage unit 1010 including the semiconductor device according to the above-described embodiments may use a tunneling transistor, in which a semiconductor material layer having a low band gap is inserted into or around a source, such as a switching device.

The operation unit 1020 may perform an operation in the microprocessor 1000 and perform a variety of four fundamental arithmetic operations depending on a command of the control unit 1030. The operation unit 1020 may include one or more arithmetic and logic units (ALUs).

The control unit 1030 may receive a signal from the storage unit 1010, the operation unit 1020, or an external apparatus of the microprocessor 1000. The control unit 1030 may perform extraction or decoding of a command, or input or output control, and may execute a process in a program form.

The microprocessor 1000 according to the embodiments of the present invention may further include a cache memory unit 1040 that may temporarily store data input from an external apparatus or data to be output to an external apparatus. The cache memory unit 1040 may exchange data with the storage unit 1010, the operation unit 1020, and the control unit 1030 through a bus 1050.

Figure 17:
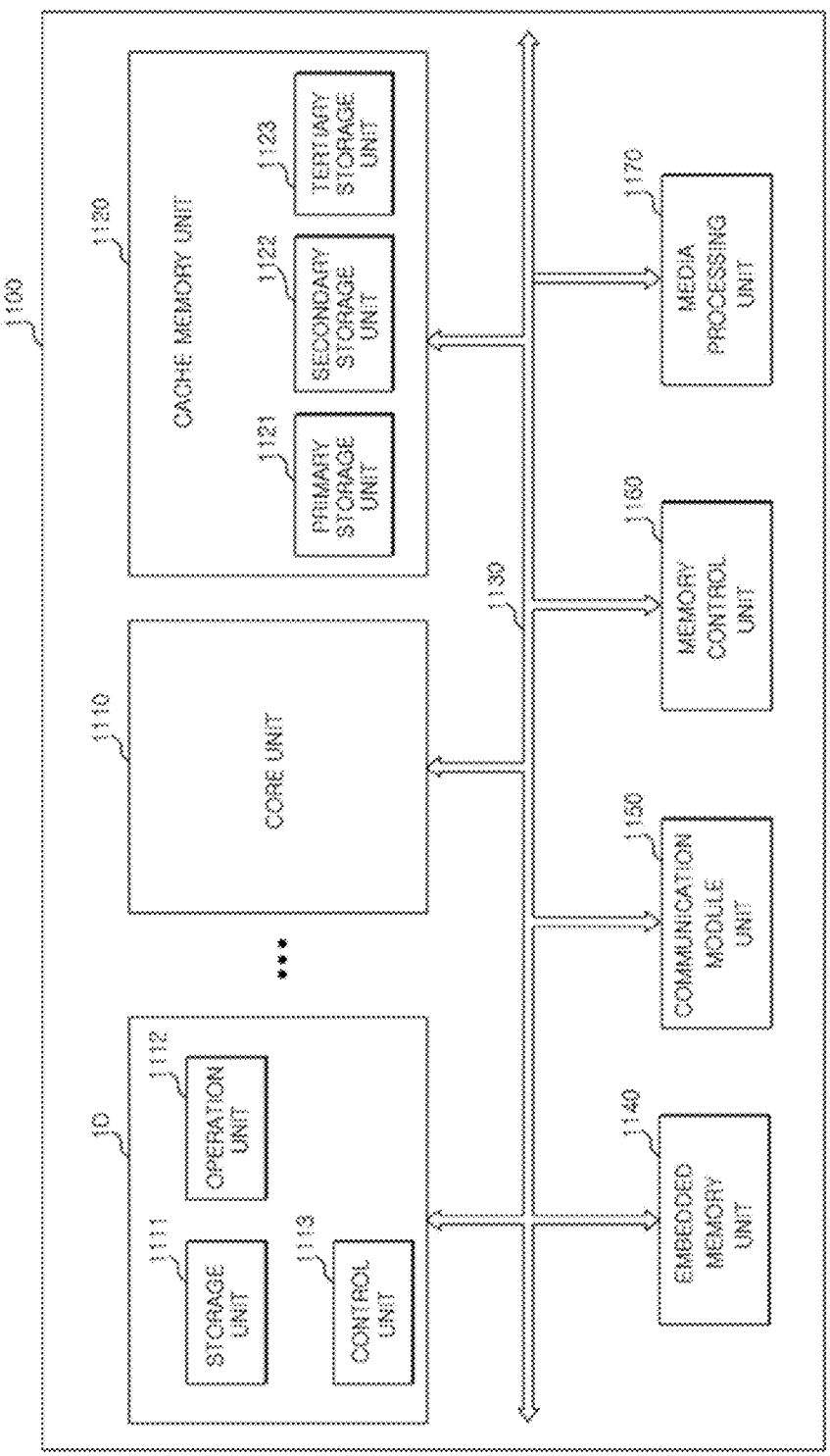

As illustrated in FIG. 17, a processor 1100 in which the semiconductor device according to an embodiment of the present invention is applied may include various functions to implement performance improvement and multifunction. This is in addition to the functions of the microprocessor that may control and adjust a series of processes which receive data from various external apparatuses, process the data, and transmit processing results to the external apparatuses. The processor 1100 may include a care unit 1110, a cache memory unit 1120, and a bus interface 1130. The core unit 1110 in an embodiment according to the present invention may perform arithmetic and logic operations on data input from an external apparatus, and include a storage unit 1111, an operation unit 1112, and a control unit 1113. The processor 1100 may be a variety of system on chips (SoCs) such as a multi core processor (MCP), a graphics processing unit (GPU), or an application processor (AP).

The storage unit 1111 may be a processor register or a register, and the storage unit 1111 may be a unit that may store data in the processor 1100 and include a data register, an address register, and a floating point register. The storage unit 1111 may include various registers. The storage unit 1111 may temporarily store data to be operated on in the operation unit 1112, resulting data that was processed in the operation unit 1112, and an address in which the data to be operated on is stored.

The operation unit 1112 may be a unit that may perform an operation in the processor 1100 and perform a variety of four fundamental rules of an arithmetic operation or logic operations depending on a decoding result of a command in the control unit 1113. The operation unit 1112 may include one or more arithmetic and logic units (ALUs). The control unit 1113 receives a signal from the storage unit 1111, the operation unit 1112, or an external apparatus of the processor 1100, performs extraction or decoding of a command, or input or output control, and executes a process in a program form.

The cache memory unit 1120 may temporarily store data to improve the data processing rate of a low speed external apparatus. The cache memory unit 1120 may include a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory unit 1120 may include more storage units. That is, the number of storage units included in the cache memory unit 1120 may vary according to design.

Processing rates of the primary, secondary, and tertiary storage units 1121, 1122, and 1123 may be the same as or different from each other. When the processing rates of the storage units are different from each other, the processing rate of the primary storage unit may be set as the greatest.

One or more of the primary storage unit 1121, the secondary storage unit 1122, and the tertiary storage unit 1123 in the cache memory unit 1200 may include the semiconductor device according to an embodiment of the present invention. The cache memory unit 1120 including the semiconductor device according to the above-described embodiments may use a tunneling transistor, in which a semiconductor material layer having a low band gap is inserted into or around a source, such as a switching device.

Figure 18:
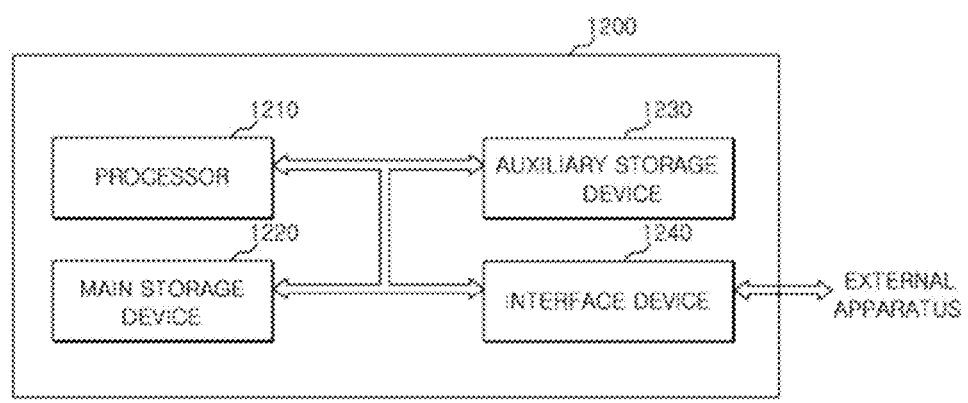

Further, FIG. 18 illustrates that all the primary, secondary, tertiary storage units 1121, 1122, and 1123 are disposed in the cache memory unit 1120. However, some or all of the primary, secondary, tertiary storage units 1121, 1122, and 1123 in the cache memory unit 1120 may be disposed outside the core unit 1110 and may supplement the difference between the processing rates of the core unit 1110 and an external apparatus. Further, the primary storage unit 1121 of the cache memory unit 1120 may be located in the core unit 1110, and the secondary storage unit 1122 and the tertiary storage unit 1123 may be located outside the core unit 1110 to further supplement the processing rate.

The bus interface 1130 may couple the core unit 1110 and the cache memory unit 1120 to efficiently transmit data.

The processor 1100 according to the embodiments may include a plurality of core units 1110, and the core units 1110 may share the cache memory unit 1120. The core units 1110 and the cache memory unit 1120 may be coupled through the bus interface 1130. The core units 1110 may have the same configuration as the above-described core unit 1110. When the core units 1110 are provided, the primary storage unit 1121 of the cache memory unit 1120 may be disposed in each of the core units 1110 corresponding to the number of core units 1110, and one secondary storage unit 1122 and one tertiary storage unit 1123 may be disposed outside the core units 1110 so that the core units share the secondary and tertiary storage units through the bus interface 1130. The processing rate of the primary storage unit 1121 may be greater than those of the secondary and tertiary storage units 1122 and 1123.

The processor 1100 according to the embodiments may further include an embedded memory unit 1140 that may store data, a communication module unit 1150 that may transmit and receive data to and from an external apparatus in a wired or a wireless manner, a memory control unit 1160 that may drive an external storage device, and a media processing unit 1170 that may process data processed in the processor 1100 or data input from an external input device and may output a processing result to an external interface device. The processor may further include a plurality of modules in addition to the above-described components. The additional modules may transmit data to and receive data from the core unit 1110 and the cache memory unit 1120, and transmit and receive data therebetween through the bus interface 1130.

The embedded memory unit 1140 may include volatile memory as well as nonvolatile memory. The volatile memory may include a dynamic random access memory (DRAM), a mobile DRAM, a static RAM (SRAM), or the like. The nonvolatile memory may include a read only memory (ROM), a NOR flash memory, a NAND flash memory, a phase-change RAM (PCRAM), a resistive RAM (RRAM), a spin transfer torque RAM (STTRAM), a magnetic RAM (MRAM), or the like. The semiconductor device according to the embodiments may also be applied to the embedded memory unit 1140.

The communication module unit 1150 may include a module coupled to a wired network and a module coupled to a wireless network. The wired network module may include a local area network (LAN) a universal serial bus (USB), Ethernet, power line communication (PLC), or the like. The wireless network module may include Infrared Data Association (IrDA), Code Division Multiple Access (COMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like.

The memory control unit 1160 may manage data transmitted between the processor 1100 and an external storage apparatus that may operate according to a different communication standard from the processor 1100. The memory control unit 1160 may include a variety of memory controllers or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDRC) card, a memory stick card, a smart media (SM) card, a multimedia card (MMC), an embedded MMC (eMMC), a compact flash (CF) card, or the like.

The media processing unit 1170 may process data processed in the processor 1100 or data input from an external input device, and may output a processing result to an external interface device so that the processing result may reproduce video, sound, etc. The media processing unit 1170 may include a GPU, a DSP, HD audio, a high definition multimedia interface (HDMI) controller, or the like.

As illustrated in FIG. 18, a system 1200 to which the semiconductor device according to an embodiment of the present invention is applied may be a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiments may include a variety of electronic systems that may operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may decode an input command and processing such as an operation and comparison of data stored in the system, and may include a MPU, a CPU, a single/multi core processor, a GPU, an AP, a DSP, or the like.

The main storage device 1220 may receive a program or data from the auxiliary storage device 1230 and execute the program or the data. The main storage device 1220 retains the stored data even when power is interrupted, and may include a semiconductor device according to the above-described embodiments. The main storage device 1220 may use a tunneling transistor, in which a semiconductor material layer having a low band gap is inserted into or around a source, such as a switching device.

The main storage device 1220 according to the embodiment may further include an SRAM or a DRAM of a volatile memory type in which all data is lost when power is off. Alternatively, the main storage device 1220 may not include a semiconductor device according to the embodiments but may include an SRAM or a DRAM of a volatile memory type in which all data is lost when power is off.

The auxiliary storage device 1230 may store a program code or data. The auxiliary storage device 1230 may have a lower data processing rate than the main storage device 1220, but may store large amounts of data and include a semiconductor device according to the above-described embodiments. The auxiliary storage unit 1230 may also use a tunneling transistor, in which a semiconductor material layer having a low band gap is inserted into or around a source, such as a switching device.

The area of the auxiliary storage device 1230 according to the embodiments of the present invention may be reduced, so that the overall size of the system 1200 is reduced and portability of the system 1200 is increased. Further, the auxiliary storage device 1230 may further include a data storage system (not shown), such as a magnetic tape or a magnetic disc, a laser disc using light, a magneto-optical disc using magnetism and light, an SSD, a USB memory, a SD card, a mSD card, a micro SD card, a SDHC card, a memory stick card, a SM card, a MMC, an eMMC, or a CF card. Alternatively, the auxiliary storage device 1230 may not include a semiconductor device according to the above-described embodiments but may include a data storage system (not shown), such as a magnetic tape or a magnetic disc using a magnetism, a laser disc using light, a magneto-optical disc using magnetism and light, an SSD, a USB memory, a SD card, a mSD card, a micro SD card, a SDHC card, a memory stick card, a SM card, a MMC, an eMMC, or a CF card.

The interface device 1240 may exchange a command and data of an external apparatus with the system of the embodiment, and may be a keypad, a keyboard, a mouse, a speaker, a microphone, a display, a variety of Human Interface Devices (HIDs), or a communication device. The communication device may include multiple modules such as a module coupled to a wired network and a module coupled to a wireless network. The wired network module may include a LAN, a USB, Ethernet, PLC, or the like. The wireless network module may include IrDA, CDMA, TDMA, FDMA, a wireless LAN, Zigbee, a USN, Bluetooth, RFID, LTE, NFC, Wibro, HSDPA, WCDMA, UVB, or the like.

What is claimed is:

1. A vertical transistor comprising:
    a pillar vertically extending from a substrate and including a source, a channel region, and a drain, wherein the channel region extends between the source and the drain;
    a gate formed over an outer surface of the pillar and overlapping the channel region; and
    a first electric field-buffering region formed in the pillar to occupy one portion of an outer surface of the channel region,
    wherein the first electric field-buffering region is formed of a material having a band gap different from that of the pillar and different from a material for forming the pillar,
    wherein the first electric field-buffering region is formed at a boundary portion between the drain and the channel region to have an annular shape, and
    wherein the first electric field-buffering region overlaps a first edge portion of the gate.

2. The vertical transistor of claim 1, wherein the gate comprises:
    a first gate surrounding the channel region; and a second gate vertically extending from the first gate and surrounding the first electric field-buffering region, wherein the second gate has a work function less than a work function of the first gate.

3. The vertical transistor of claim 1, further comprising:
a second electric field-buffering region formed in the pillar, wherein the second electric field-buffering region is formed at a boundary portion between the channel region and the source to have an annular shape, and wherein the second electric field-buffering region overlaps a second edge of the gate, and one portion of the channel region.

4. The vertical transistor of claim 3, wherein the gate comprises:
a first gate surrounding the channel region;
a second gate vertically extending from the first gate and surrounding the first electric field-buffering region; and
a third gate vertically extending from the first gate and surrounding the second electric field-buffering region,
wherein the second gate has a work function different from a work function of the first gate, and
wherein the third gate has a work function different from the work function of the first gate.

5. The vertical transistor of claim 4, wherein the work functions of the second gate and the third gate are substantially the same as each other.

6. The vertical transistor of claim 4, wherein the pillar comprises silicon,
wherein the first electric field-buffering region comprises Ge, SiGe, GaAs, SiC, or a combination thereof, and
wherein the second electric field-buffering region comprises Ge, SiGe, GaAs, SiC, or a combination thereof.

7. The vertical transistor of claim 1, further comprising:
a first lightly doped drain (LDD) region formed in the pillar and between the drain and the channel region,
wherein the LDD region is doped with a lower concentration of impurity than the drain.

8. The vertical transistor of claim 1, further comprising:
a gate insulating layer provided between the pillar and the gate.

9. A vertical transistor comprising:
a pillar including an upper junction region, a lower junction region, and a channel region positioned between the upper junction region and the lower junction region;
a gate surrounding the pillar and extending from over the upper junction region through over the channel region to over the lower junction region; and
a work function-controlling layer formed in the pillar to reduce a difference between a work function of the upper junction region and a work function of the gate or between a work function of the lower junction region and the work function of the gate, and to occupy one portion of an outer surface of the channel region,
wherein the work function-controlling layer has a band gap different from that of the pillar and different from a material for forming the pillar,
wherein the work function-controlling layer is formed (i) at a boundary portion between the upper junction and the channel region, (ii) at a boundary portion between the lower junction and the channel region, or (iii) both,
wherein the work function-controlling layer has an annular shape, and wherein the work function-controlling layer overlaps an edge of the gate.

10. The vertical transistor of claim 9, wherein the pillar comprises silicon, and
wherein the work function-controlling layer comprises Ge, SiGe, GaAs, SiC, or a combination thereof.

11. The vertical transistor of claim 9, wherein the gate comprises:
a first gate surrounding the channel region; and
a second gate connected to the first gate and surrounding the work function-controlling layer.

12. The vertical transistor of claim 11, wherein the second gate has a work function different from a work function of the first gate.

13. The vertical transistor of claim 9, further comprising:
a gate insulating layer provided between the pillar and the gate.

14. A variable resistive memory device comprising:
a semiconductor substrate including a common source region;
a vertical pillar vertically extending from the common source region;
a drain region formed in the vertical pillar;
a channel region formed in the vertical pillar and between the common source region and the drain region;
a gate surrounding the channel region and further extending over the drain region;
an electric field-buffering region formed in the vertical pillar to occupy one portion of an outer surface of the channel region,
wherein the electric field-buffering region has a band gap different from that of the vertical pillar,
wherein the electric field-buffering region is formed at a boundary portion between the drain and the channel region or between the channel region and the source to have an annular shape; and
a variable resistance region electrically coupled to the drain region.

15. The variable resistive memory device of claim 14, wherein the variable resistance region comprises:
a heating electrode arranged over the drain region; and
a phase changeable layer arranged over the heating electrode.

16. A vertical transistor comprising:
a pillar vertically extending from a substrate;
a source provided under the pillar;
a drain provided over the pillar;
a channel region provided in the pillar and extending between the source and the drain;
a gate formed over a sidewall of the pillar and over the channel region; and
a first electric field-buffering region formed in the pillar and at a boundary portion between the source and the channel region or between the drain and the channel region to have an annular shape, to occupy one portion of an outer surface of the channel region,
wherein the first electric field-buffering region has a band gap different from that of the pillar, and
wherein a difference in work function between the first electric field-buffering region and the gate is lower than a difference in work function between the drain and the gate.

* * * * *